US005587595A

United States Patent [19]

Neubrand et al.

[11] Patent Number: 5,587,595

[45] Date of Patent: Dec. 24, 1996

[54] LATERAL FIELD-EFFECT-CONTROLLED SEMICONDUCTOR DEVICE ON INSULATING SUBSTRATE

[75] Inventors: Horst Neubrand, Frankfurt; Jacek Korec, Mörfelden-Walldorf; Erhart Stein, Senftenberg; Dieter Silber, Obertshausen, all of Germany

[73] Assignee: Daimler-Benz Aktiengesellschaft, Stuttgart, Germany

[21] Appl. No.: 387,778

[22] PCT Filed: Aug. 19, 1993

[86] PCT No.: PCT/EP93/02216

§ 371 Date: Feb. 21, 1995

§ 102(e) Date: Feb. 21, 1995

[87] PCT Pub. No.: WO94/06158

PCT Pub. Date: Mar. 17, 1994

[30] Foreign Application Priority Data

Aug. 29, 1992 [DE] Germany .......................... 42 28 832.0

[51] Int. Cl.$^6$ .................................................. H01L 29/745

[52] U.S. Cl. .......................... 257/141; 257/122; 257/162

[58] Field of Search .................................... 257/121, 122, 257/140, 146, 147, 162, 172, 141

[56] References Cited

U.S. PATENT DOCUMENTS

| | | | |
|---|---|---|---|
| 4,550,332 | 10/1985 | Wagner | 257/162 |
| 4,612,448 | 9/1986 | Strack | 257/147 |
| 4,847,671 | 7/1989 | Pattanayak et al. | 257/146 |
| 5,221,850 | 6/1993 | Sakurai | 257/147 |
| 5,304,802 | 4/1994 | Kumagai | 257/146 |

FOREIGN PATENT DOCUMENTS

| | | | |
|---|---|---|---|
| 0043009 | 1/1982 | European Pat. Off. . | |
| 0409010 | 1/1991 | European Pat. Off. . | |
| 0433825 | 6/1991 | European Pat. Off. . | |
| 3942490 | 6/1991 | Germany . | |
| 63-99569 | 4/1988 | Japan | 257/147 |

OTHER PUBLICATIONS

M. S. Shekar et al.: "High–Voltage Current Saturation in Emitter Switched Thyristors". In: IEEE Electron Device Letters, vol. 12, No. 7, Jul. 1991, pp. 387–389.

B. J. Baliga: "The MOS–Gated Emitter Switched Thyristor". In: IEEE Electron Device Letters, vol. 11, No. 2, Feb. 1990, pp. 75–77.

*Primary Examiner*—Jerome Jackson

*Attorney, Agent, or Firm*—Spencer & Frank

[57] ABSTRACT

A field-effect-controlled semiconductor device has a cathode, an anode, and a gate, and extends laterally on a first insulating layer covering a substrate. The device includes a main thyristor, a MOSFET switch and a diode which connects a highly doped region embedded in a first part of a second base region of the thyristor to the cathode of the device.

8 Claims, 4 Drawing Sheets

K
G
A
60
22
48
n+
72
40
p+
n+
44
50
78
76
32
p+
p
p
34
36
38
p+
n
20
p+
10
74

D
K
G
A
82
84
86
40
60
22
44
50
38
61
62
63
64
p+
n+
n+
p+
p+
72
74
32
10
34
p
n
p
n
20
55
36
5

K
G
D
A
84
86
60
50
82
61
62
63
64
72
p+
n+
n+
p+
p+
76
32
40
44
38
10
34
p
n
p
n
20
55
22
36
5

72
40
n+
44
n+
60
50
p+
42
p
46
32
34
36
20
n
10
p+
74

22
60
72
40
n+
n+
44
50
32
p
43
36
p+
42
p
34
20
n
10
p+
74

LATERAL FIELD-EFFECT-CONTROLLED SEMICONDUCTOR DEVICE ON INSULATING SUBSTRATE

BACKGROUND OF THE INVENTION

1. Field of the Invention

The invention relates to a field-effect-controlled semiconductor device having at least four regions of alternating opposite conduction type, in which regions are configured an anode-end emitter region, a first and second base region adjoining this anode-end emitter region, a cathode-end emitter region and a further adjacently disposed emitter region, wherein the two last-mentioned emitter regions form source and drain of a MOS field-effect transistor having an anode contact, a contact at the cathode-end emitter region and a control electrode contact of the MOS field-effect transistor.

A field-effect-controlled semiconductor device of the above-described type is known from U.S. Pat. No. 4,847, 671. Such a semiconductor device mentioned in the patent specification "Emitter Switched Thyristor" (EST) is illustrated in the FIG. 5 and 6 and will be explained in greater detail in the following text. The field-effect-controlled semiconductor device, whose structure is illustrated in the FIG. 5 and 6, comprises an anode-end emitter region 10, a first base region 20, adjoining this anode-end emitter region followed by two second base regions 34, 36 and two cathode-end emitter regions 40, 44. On an insulating layer 50, which covers a part of the cathode-end base region 30, there is disposed a control electrode contact 60 called a gate, which forms a field-effect transistor with the cathode-end emitters 40, 44 and a channel region 42, 43. The device is provided with two power supply connections, a cathode 72 and an anode 74. Two thyristor structures are recognizable in the device described. The first, parasitic thyristor structure comprises the cathode-end emitter region 40, the two base regions 32, 20 adjoining this cathode-end emitter region and the anode-end emitter region 10 and may not be ignited in any operating condition. The second thyristor structure with the other cathode-end emitter structure 44, the two base regions 36, 20 adjoining this cathode-end emitter structure and the anode-end emitter region 10 form the main current path in the switched-on state.

The cathode-end emitter 40 is short-circuited with the cathode-end base region 34 via the cathode contact 72. In order to configure this shunt to be low-ohmic, the base region 30 is highly doped in a partial region 32. The main thyristor structure 44, 36, 20, 10 is controlled by a field-effect transistor 40, 50, 60, 44 and channel region 42, 43.

In the one embodiment of the known semiconductor device illustrated in FIG. 5, the doping in a moderately doped partial base region 34 determines the threshold voltage of the field-effect transistor and the injection efficiency of the cathode-end emitter 44. If the semiconductor device is polarized in forward direction and if the gate connection 60 of the field-effect transistor is actuated with a positive potential vis-a-vis the cathode, a conductive channel 42 forms in the p-base region 34, this channel connecting the two cathode-end emitters 40, 44 at a low resistance.

Simultaneously, a conductive channel 46 forms between the emitter 44 and the first base region 20. The electron current thus created acts as control current for an anode-end p-n-p transistor and offers the gate trigger current or hold current for the main thyristor 44, 34, 20, 10. The hole current flowing off toward the cathode contact 72 via the partial region 34 of the base region 30 polarizes the $n^+$-emitter 44 in forward direction and the injected electrons reinforce the conductance modulation of the moderately doped n-base region 20.

The regenerative actuation of the thyristor can be interrupted by equating the gate potential with the cathode potential so that the n-conducting channel of the field effect transistor disappears and the electron current is interrupted.

This process leads to the switching-off of the semiconductor component. The component structure according to FIG. 5 must be very carefully optimized, because the $n^+$-emitter of the parasitic thyristor structure 40, 30, 20, 10 is partially embedded in the same partial region 34 of the base region 30 as the emitter 44 but may not be polarized in forward direction in any operating condition. This limitation increases the gate trigger current and limits the maximum current of the component that can be switched off.

A more advantageous known embodiment is shown in FIG. 6. In the structure according to FIG. 6, the cathode-end base region 34 of FIG. 5 is divided into two partial regions 34, 36, wherein the partial regions 34, 36 are separated by an n-doped region 22 of the first n-base region 20.

The highly-doped partial region 32 provides a low-ohmic shunt of the anode-end emitter 40. The other partial region 34 defines the threshold voltage of the channel region 42, and the field-effect transistor 40, 42, 22 provides the gate trigger current for the main thyristor. The independently fabricated partial region 36 can be optimized with respect to the injection efficiency of the $n^+$-emitter 44 and the resistance of a shunt. This shunt of the emitter 44 is implemented via a resistance coupling of the partial region 36 to the cathode contact 72. The main thyristor structure 44, 36, 20, 10 is connected to the cathode 72 via a conductive channel 42, 22, 43 of the field-effect transistor.

An equivalent circuit diagram of the semiconductor device according to FIG. 6 is illustrated in FIG. 7. The separation of the partial regions 32, 36 facilitates the layout of shorting resistors $R_1$ and $R_2$. The resistance of resistor $R_1$ should be kept as low as possible, and the value of resistor $R_2$ must be optimized with respect to the switching characteristics of the device. With regard to the optimization, however, a compromise between the forward voltage and the maximum current that can be switched off must be accepted.

It is also known to connect the first base region 36 adjacent to the emitter region 44 of the main thyristor via a diode D with the cathode. The depletion of charge carriers is easily achieved when the device is switched off.

FIG. 1 schematically illustrates the structure of a field-effect-controlled semiconductor device, combining some known features, having a highly p-doped emitter layer 10 at the anode-end, with a first base region 20 comprising an n-doped region, with a second base region that is provided with a partial region 32 having a high p-doping, and a partial region 34 with p-doping as well as a further partial region 36 with p-doping and having highly n-doped emitter regions 40, 44 at the cathode-end.

The semiconductor device is provided with an anode connection A of an anode contact 74, a cathode connection K of a cathode contact 72 and a gate connection G of a gate 60. An insulating layer 50 separates the gate 60 from the base regions 20, 22, 34, 36 and from the cathode-end emitter regions 40, 44. The partial regions 34, 36 of the second base region are separated from each other by an n-doped region 22 of the first base region 20.

The semiconductor device contains a main thyristor structure having the cathode-end emitter region 44, the first and second base region 20, 34, 36 and the anode-end emitter layer 10. The main thyristor structure is controlled by means of a field-effect transistor comprising the cathode-end emitter regions 40, 44, the insulating layer 50 and the gate 60.

The cathode contact 72 forms an ohmic contact both with the emitter region 40 and with the partial region 32 of the second base region. The second base region is divided into the partial regions 32, 34 and 36. It is obvious that, to this extent, the semiconductor device of FIG. 1 corresponds to the known semiconductor device illustrated in FIG. 6.

In the semiconductor structure illustrated in FIG. 1, a highly p-doped region 38, which is disposed adjacent to the cathode-end base region adjoining the emitter region 44 of the main thyristor, is connected to the cathode contact 72 via an integrated component having a non-linear current/voltage characteristic.

In the highly-doped partial region 32 of the second base region a highly n-doped region 48 is provided, which is connected to a contact 76 via an ohmic contact and a metallic line which is configured as a track and, in contrast to the illustration according to FIG. 1, extends in the third dimension, the contact being adjacent to the region 38. The p-n junction between the $n^+$-region 48 and the $p^+$-region 32 acts in the manner of a Zener diode polarized in reverse direction, the diode being connected in the third dimension to the partial region 36, 38 of the base region via the contacts 76, 78 and the metal track.

The partial region 38 was provided to improve the ohmic metal/semiconductor junction 76, 38, but it may be omitted, because a Schottky contact would not impede the operation of the component at this point. Therefore, the partial region 36 may also be connected directly to the contact 78 by means of a contact and a metallic line.

But it is also possible that, in the structure illustrated in FIG. 5, the partial region 34, corresponding to the region 38 according to FIG. 1, is connected to a highly n-doped region in the partial region 32 and is thus linked to the cathode contact 72 via a contact, a metallic conductor and a further contact, with the cathode contact then not extending over the entire partial region 32.

SUMMARY OF THE INVENTION

It is an object of the invention to hinder the development of parasitic structures.

It is an additional object of the invention to further develop a field-effect-controlled semiconductor device of the generic type described in the introduction so as to ensure the most advantageous on-state behavior of a thyristor given a simultaneously expanded safe operating area (SOA).

In order to achieve the above object, the present invention provides a lateral thyristor structure, where the emitter 44 is electrically isolated from the emitter zone 40 by at least one p-n transition which blocks the generation of parasitic transistors or thyristors, because the second part of the anode-end base does not border to the partial region of the cathode-end base region which envelopes the cathode emitter region. The partial region of the cathode-end base region, which adjoins the emitter region of a main thyristor comprising this emitter region, the first and second base region and the anode-end emitter region, or a separate $p^+$-doped region adjacent to the cathode-end base region is linked to the cathode contact via an integrated device.

In this arrangement, as in the previously known solution, the main thyristor emitter is linked to the potential of the cathode by switching on the field-effect transistor. The non-linear coupling of the base region adjoining the main thyristor emitter shows a high resistance in the range of small current densities. This causes a fast increase in potential of this region and a on-state polarization of the main thyristor emitter, which leads to a regenerative actuation of the thyristor. When the field-effect transistor is switched off, the electric potential of the base region will exceed the threshold voltage of the coupling element; the load current flowing off via this path meets a low dynamic resistance on the way to the cathode contact.

In the forward case, the linkage according to the invention of the partial region of the cathode-end base region, this partial region being disposed in the proximity of the emitter, increases the on-state polarization of the thyristor emitter and improves the on-state behavior of the device. The low dynamic resistance of the base coupling in the presence of high current densities, on the other hand, facilitates the switching off of the component and expands the safe operating area.

An advisable embodiment consists of an electrical connection of the emitter-adjoining partial region of the cathode-end base region to the cathode contact via a monolithically integrated Zener diode or avalanche diode polarized in reverse direction.

A second embodiment utilizes the existing layer of polycrystalline silicon for the fabrication of a diode chain polarized in forward direction, with the diode chain then being used as coupling element with a non-linear current/voltage characteristic.

BRIEF DESCRIPTION OF THE DRAWINGS

In the following, the invention is described in greater detail by way of an embodiment illustrated in a drawing, from which further details, characteristics and advantages ensue.

The Figures show.

DETAILED DESCRIPTION OF THE PREFERRED EMBODIMENT(S)

Figure 1:
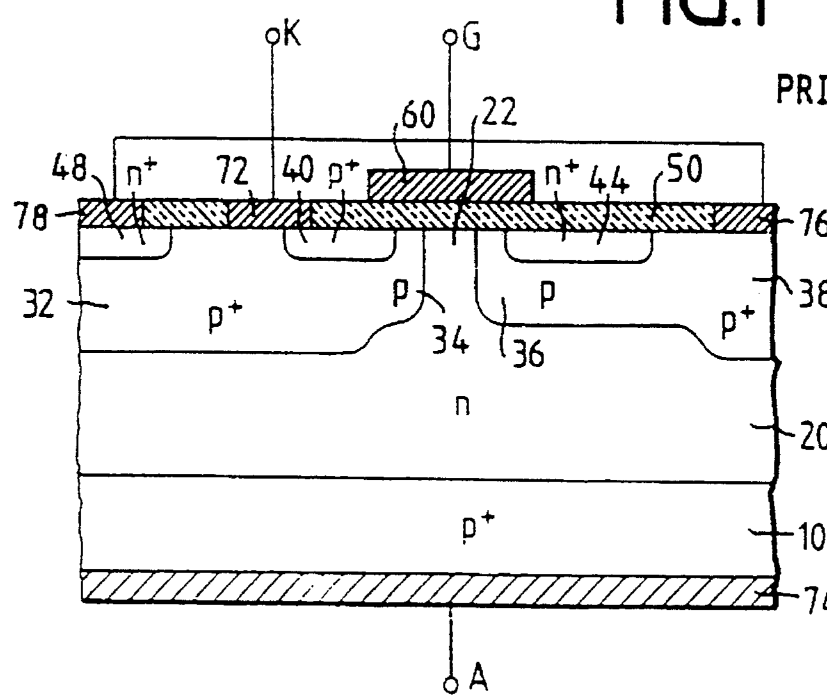
FIG. 1 cross section of a rather obvious structure of a field-effect-controlled semiconductor device.

In the FIGS. 1 through 7, identical elements were given identical reference numerals.

Figure 2A:
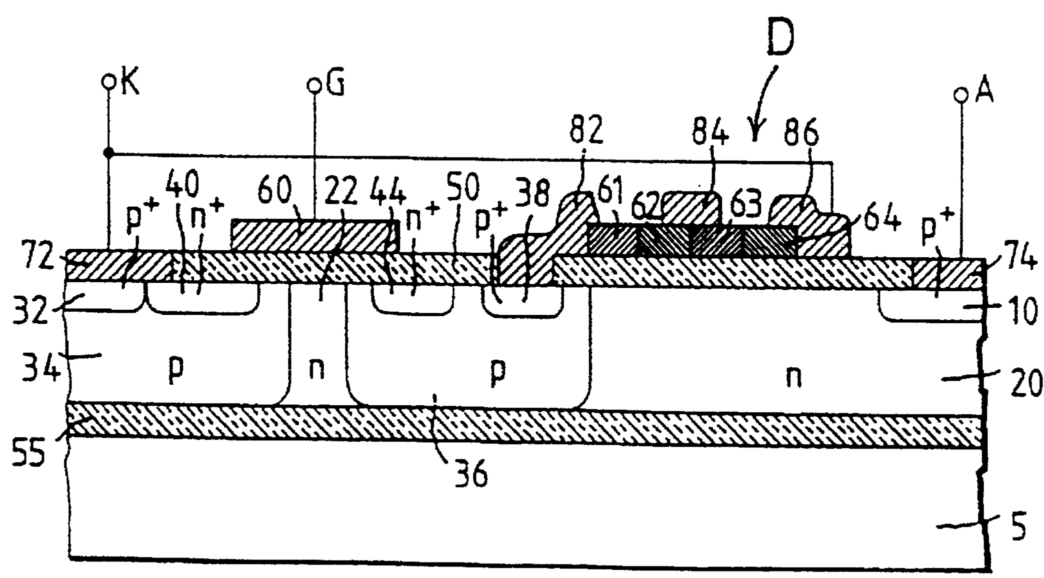
FIG. 2*a* cross section of a structure of an embodiment of a field-effect-controlled semiconductor device.

FIG. 2*a* shows an embodiment in which the partial region 36 adjoining the emitter 44 of the main thyristor is linked to the cathode contact 72 via a diode chain polarized in forward direction.

The semiconductor device illustrated in FIG. 2*a* is provided in lateral form with the highly p-doped emitter layer 10 at the anode-end, the first base region 20 with n-doping, the second base region with the highly p-doped partial region 32, the p-doped partial region 34 and the partial region 36 which is separated from these partial regions 32, 34 by an n-layer 22. There are also the emitter regions 40, 44 and the highly p-doped region 38. An anode connection A with the anode contact 74 and a cathode connection K with the cathode contact 72 are also present. A gate 60 is provided on an insulating layer 50 extending from the region 38, which is partially covered by the insulating layer, over the partial region 36, the emitter region 44, the n-layer 22 of the first base region 20, the partial region 34 up to a highly n-doped region 40, the latter being partially covered by the insulating layer. The other portion of the region 40 and the partial region 32 are covered by the cathode contact 72.

The diode chain polarized in forward direction is fabricated by an alternating $p^+$-doping 61, 63 and an $n^+$-doping 62, 64 of a semiconductor layer made of polycrystalline silicon on an insulating layer and a corresponding metallization 82, 84, 86.

In FIG. 2*a*, a particularly advisable embodiment of the invention was selected as a lateral component on an SOI-substrate (silicon on insulator). In this case, the active semiconductor layer is separated from a carrier 5 by an insulating layer 55, preferably made of thermally grown silicon oxide. There is no current path via a parasitic thyristor structure in this lateral embodiment of the component, because the partial regions 34, 36 of the second base region are separated by the n-doped partial region 22. The partial region 36 is projecting to the layer 55 and shields the remainder of the component. The gate trigger current can be provided through a conductive channel of the field-effect transistor.

Figure 2B:
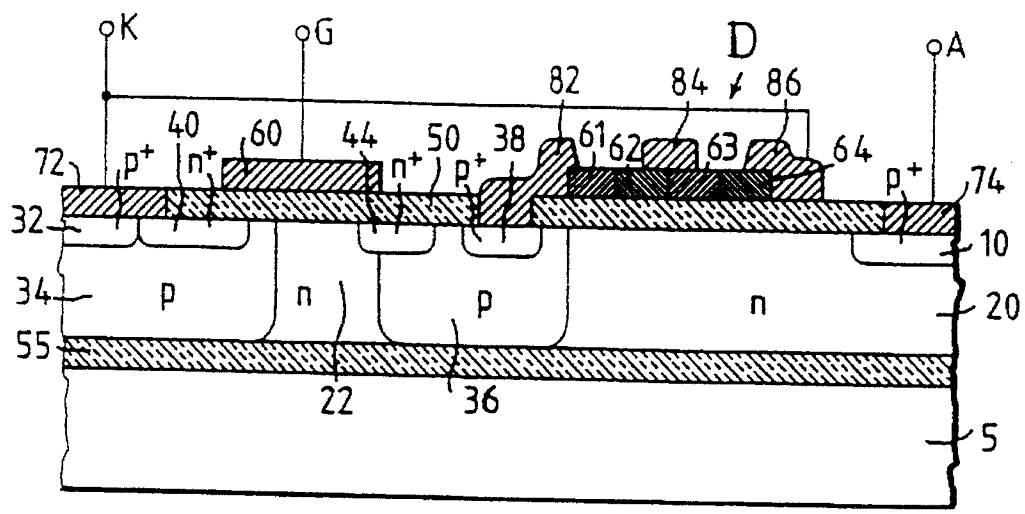
FIG. 2*b* cross section of a structure of a further embodiment of a field-effect-controlled semiconductor device.

FIG. 2*b* shows a preferred embodiment that differs from the embodiment in FIG. 2*a* in that the base part 36 no longer completely envelops the emitter 44. Two important consequences are:

1. The parasitic pnpn-thyristor structure 34/22/36/44 at the surface is eliminated. The limitation of the maximum turn-off current by the latching current of this parasitic thyristor structure is thus eliminated.
2. A smaller distance between the emitters 40 and 44 can be achieved while the base thickness of the parasitic pnp-transistor 34/22/36 can be increased. Smaller distance of the emitters 40 and 44 means smaller length of the channel under the gate G, which will result in smaller forward voltage decay compared to FIG. 2*a*. Large base thickness of the parasitic pnp transistor 34/22/36 will result in a higher breakdown voltage of this parasitic transistor, thus a higher maximum turn-off current of the main thyristor can be achieved.

Figure 2C:
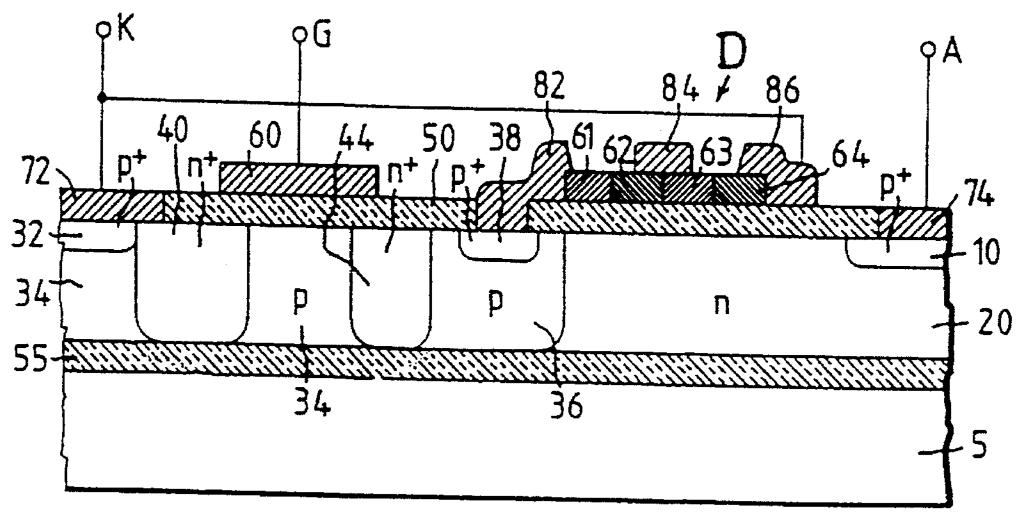
FIG. 2*c* cross section of a structure of an additional embodiment of a field-effect-controlled semiconductor device.

FIG. 2*c* shows an embodiment which only differs from the embodiment in FIG. 2*a* in that the p-base 34, 36 is interrupted by the $n^+$-emitters 40 and 44 extending up to the insulating layer 55. This leads to an ideal electric decoupling of partial regions 36 and 34 and to an improvement in the function of the main thyristor.

The embodiments described above do not require any additional fabrication steps and can be implemented within the normal sequence of processes for the production of the EST device. A third embodiment having a separately disposed $p^+$-region is shown in FIG. 4.

Figure 4:
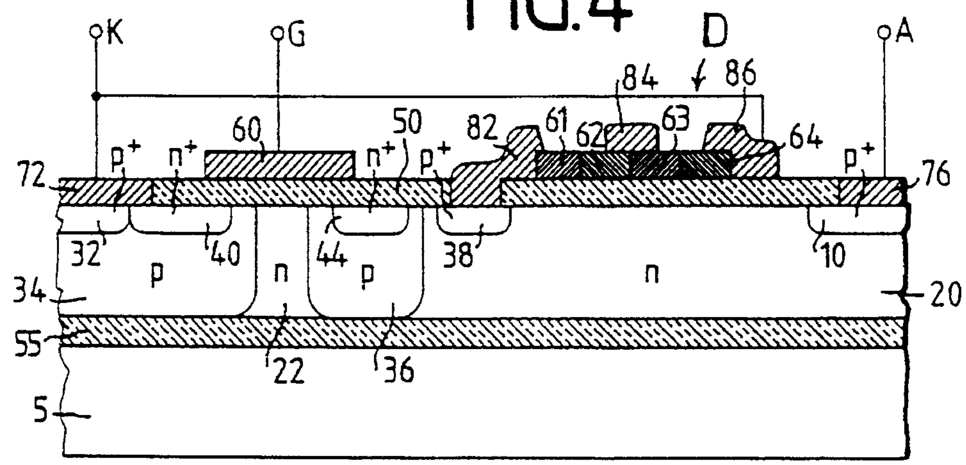
FIG. 4 cross section of a structure of a further embodiment of a field-effect-controlled semiconductor device.
Figure 5:
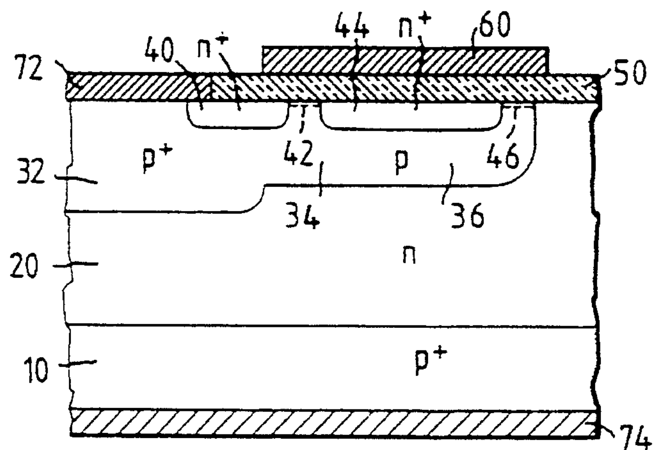
FIG. 5 cross section of a structure of a known field-effect-controlled semiconductor device.
Figure 6:
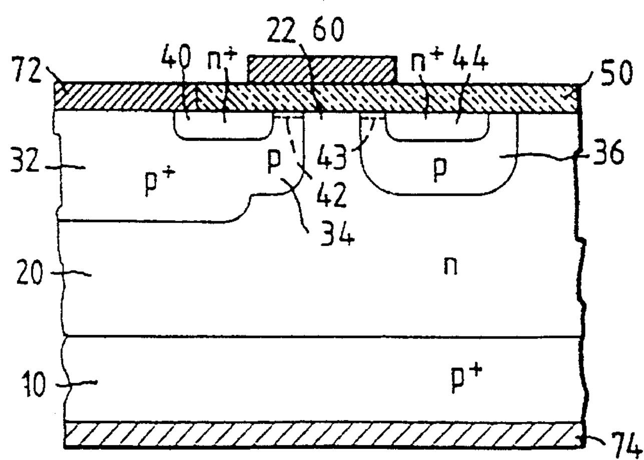
FIG. 6 cross section of a structure of a further known field-effect-controlled semiconductor device and FIG. 7 an equivalent circuit diagram for the semiconductor device illustrated in FIG. 5.

The embodiment according to FIG. 4 corresponds with the embodiment illustrated in FIG. 2*a* with the exception of the position of the highly p-doped region 38. The region 38 is disposed in the first base region 20 or it is separated by the latter from partial region 36. As in the configuration according to FIG. 2*a*, the region 38 is connected to a metallization 82, which is also connected to the n-doped layer 61 of the diode chain.

Figure 3:
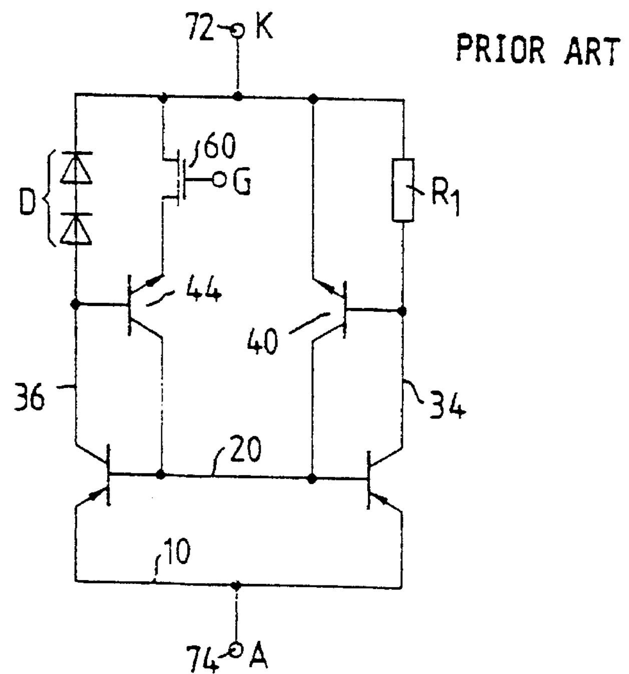
FIG. 3 an equivalent circuit diagram for the semiconductor device illustrated in FIG. 2.
Figure 7:
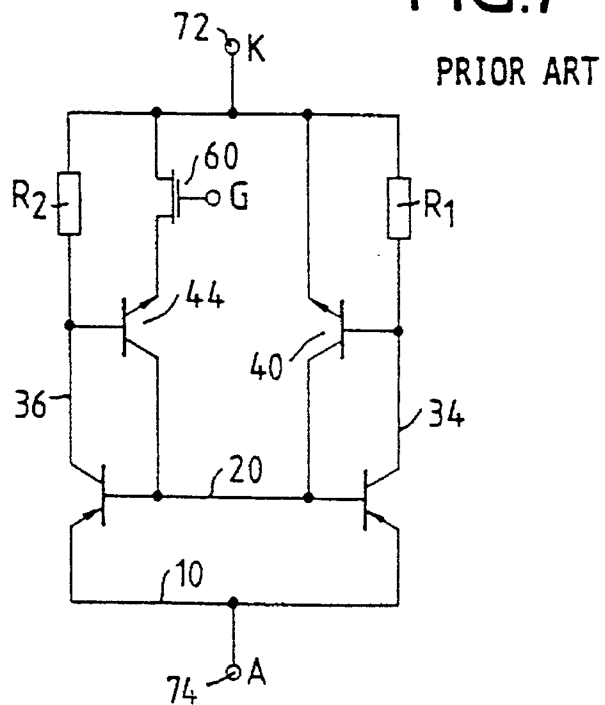

FIG. 3 shows the equivalent circuit diagram of the semiconductor devices described above. In the equivalent circuit diagram, the component with non-linear current/voltage characteristic is identified by the element D.

The configuration of D as a diode chain corresponds to FIG. 2. It is obvious that this Zener diode according to FIG. 2*a* could also be configured in polycrystalline silicon technology.

All embodiments apply analogically to structures of complimentary design in which the n-regions and p-regions are respectively reversed as to their type of conductivity.

We claim:

1. A field-effect-controlled semiconductor device, having a cathode (K), an anode (A) and a gate (G), the field-effect-controlled semiconductor device extending laterally on a first insulating layer (55) covering a substrate (5), the field-effect-controlled semiconductor device comprising:

(I) a main thyristor including:

a first anode-end emitter region (10) forming the anode (A) of the field-effect-controlled semiconductor device;

a first base region (20) bordering the first insulating layer (55) and the first anode-end emitter region (10), and being of an opposite conductivity-type material than the first anode-end emitter region (10);

a second base region having first and second parts;

wherein the first part (36) of the second base region borders the first base region (20) and the first insulating layer (55), and is of the same conductivity-type material as the first anode-end emitter region (10);

wherein a highly doped region (38) is embedded in the first part (36) of the second base region; and wherein the second part (34) of the second base region borders the first insulating layer (55), and is of the same conductivity-type material as the first part (36) of the second base region;

a second emitter region (44) of the main thyristor, the second emitter region bordering the first part (36) of the second base region;

an intermediate region (22) totally separating the first part (36) of the second base region from the second part (34) of the second base region, the intermediate region (22) being of an opposite conductivity-type material than the first (36) and second (34) parts of the second base region; and a second insulating layer (50), the second insulating layer (50) being an oxide layer;

wherein all of the regions of the main thyristor are disposed under at least one of:

the second insulating layer (50), and/or metallic electrodes;

(II) a MOSFET switching device including:

the second emitter region (44), disposed under the second insulating layer (50), and forming a drain of the MOSFET switching device;

a cathode-end emitter region (40), bordering the second part (34) of the second base region, the cathode-end emitter region (40) being partly covered by the second insulating layer (50) and contacting a cathode electrode (72) at the cathode (K) of the device, the cathode-end emitter region (40) forming a source of the MOSFET switching device; and a gate electrode (60) formed on the second insulating layer (50) above the intermediate region (22), thereby forming the gate (G) of the field-effect-controlled semiconductor device; and (III) a diode device (D) connecting the highly doped region (38) embedded in the first part (36) of the second base region, to the cathode (K) of the field-effect-controlled semiconductor device.

2. The semiconductor device according to claim 1, wherein the diode device (D) comprises one of:

a Zener diode, or an avalanche diode operated in a reverse direction.

3. The semiconductor device according to claim 1, wherein the diode device (D) comprises a chain of diodes operated in a forward direction.

4. The semiconductor device according to claim 1, wherein the diode device (D) connecting the highly doped region (38) embedded in the first part (36) of the second base region to the cathode (K) of the field-effect-controlled semiconductor device comprises:

a diode chain D, formed as a semiconductor layer on the second insulating layer (50), of alternating highly p-doped and n-doped regions (61, 62, 63, 64) and corresponding metallizations (82, 84, 86);

wherein a first end of the diode chain is connected to the highly doped region (38) embedded in the first part (36) of the second base region by one of said corresponding metallizations (82), and wherein a second other end of the diode chain is connected to another one of said corresponding metallizations (86) which is connected to the cathode contact (72).

5. The semiconductor device according to claim 1, wherein a portion of the first part (36) of the second base region adjoins the second emitter region (44) of the main thyristor, and extends to the first insulating layer (55).

6. The semiconductor device according to claim 1, wherein a portion of the first part (36) of the second base region adjoins the second emitter region (44) of the main thyristor, partially envelops the second emitter region (44), and extends from the second insulating layer (50) to the first insulating layer (55).

7. The semiconductor device according to claim 1, wherein the cathode-end emitter region (40) and the second emitter region (44) extend to the first insulating layer (55), and wherein the second part (34) of the second base region is disposed between the cathode-end emitter region (40) and the second emitter region (44).

8. The semiconductor device according to claim 1, wherein the second emitter region (44) forms the intermediate region separating the first part (36) of the second base region from the second part (34) of the second base region.

* * * * *